(12) United States Patent
Ramer et al.

(10) Patent No.: US 8,853,668 B2
(45) Date of Patent: Oct. 7, 2014

(54) LIGHT EMITTING REGIONS FOR USE WITH LIGHT EMITTING DEVICES

(75) Inventors: Jeff Ramer, Fremont, CA (US); Steve Ting, Dublin, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/249,146

(22) Filed: Sep. 29, 2011

(65) Prior Publication Data

US 2013/0082236 A1 Apr. 4, 2013

(51) Int. Cl.
*H01L 33/32* (2010.01)
*H01L 33/40* (2010.01)

(52) U.S. Cl.
USPC .......... 257/13; 257/14; 257/76; 257/98; 257/E33.025; 257/E33.034

(58) Field of Classification Search
USPC ....................................... 257/13–15
See application file for complete search history.

(56) References Cited

U.S. PATENT DOCUMENTS

| | | | |
|---|---|---|---|
| 5,306,662 | A | 4/1994 | Nakamura et al. |
| 5,408,120 | A | 4/1995 | Manabe et al. |
| 5,432,808 | A | 7/1995 | Hatano et al. |
| 5,468,678 | A | 11/1995 | Nakamura et al. |
| 5,563,422 | A | 10/1996 | Nakamura et al. |
| 5,578,839 | A | 11/1996 | Nakamura et al. |
| 5,734,182 | A | 3/1998 | Nakamura et al. |
| 5,747,832 | A | 5/1998 | Nakamura et al. |
| 5,753,939 | A | 5/1998 | Sassa et al. |
| 5,766,783 | A | 6/1998 | Utsumi et al. |
| 5,777,350 | A | 7/1998 | Nakamura et al. |
| 5,959,307 | A | 9/1999 | Nakamura et al. |
| 5,959,401 | A | 9/1999 | Asami et al. |
| 6,005,258 | A | 12/1999 | Manabe et al. |
| 6,040,588 | A | 3/2000 | Koide et al. |
| 6,045,626 | A | 4/2000 | Yano et al. |
| RE36,747 | E | 6/2000 | Manabe et al. |
| 6,121,635 | A | 9/2000 | Watanabe et al. |
| 6,215,133 | B1 | 4/2001 | Nakamura et al. |
| 6,242,764 | B1 | 6/2001 | Ohba et al. |

(Continued)

FOREIGN PATENT DOCUMENTS

| | | |
|---|---|---|
| JP | 4267376 | 9/1992 |
| JP | 2626431 A | 5/1994 |

(Continued)

OTHER PUBLICATIONS

Bae, et al. Surface Investigation of a Cubic AlN Buffer Layer and GaN Grown on Si(111) and Si(100) as Revealed by Atomic Force Microscopy. Journal of the Korean Physical Society, vol. 49, No. 3, Sep. 2006, pp. 1092-1096.

(Continued)

*Primary Examiner* — Thanh Nguyen
(74) *Attorney, Agent, or Firm* — Hogan Lovells US LLP

(57) ABSTRACT

A light emitting device comprises a first layer having an n-type Group III-V semiconductor, a second layer adjacent to the first layer, the second layer comprising an active material that generates light upon the recombination of electrons and holes. The active material in some cases has one or more V-pits at a density between about 1 V-pit/$\mu m^2$ and 30 V-pits/$\mu m^2$. The light emitting device includes a third layer adjacent to the second layer, the third layer comprising a p-type Group III-V semiconductor.

28 Claims, 7 Drawing Sheets

(56) References Cited

U.S. PATENT DOCUMENTS

| | | |
|---|---|---|
| 6,265,726 B1 | 7/2001 | Manabe et al. |
| 6,326,236 B1 | 12/2001 | Koide et al. |
| 6,420,733 B2 | 7/2002 | Koide et al. |
| 6,441,403 B1 | 8/2002 | Chang et al. |
| 6,469,324 B1 | 10/2002 | Wang |
| 6,541,293 B2 | 4/2003 | Koide et al. |
| 6,610,995 B2 | 8/2003 | Nakamura et al. |
| 6,611,002 B2 | 8/2003 | Weeks et al. |
| 6,617,060 B2 | 9/2003 | Weeks et al. |
| 6,649,287 B2 | 11/2003 | Weeks, Jr. et al. |
| 6,657,236 B1 | 12/2003 | Thibeault et al. |
| 6,784,462 B2 | 8/2004 | Schubert |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,001,791 B2 | 2/2006 | Kryliouk et al. |
| 7,026,653 B2 | 4/2006 | Sun |
| 7,071,498 B2 | 7/2006 | Johnson et al. |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,148,517 B2 | 12/2006 | Tu et al. |
| 7,154,121 B2 | 12/2006 | Hsieh et al. |
| 7,193,246 B1 | 3/2007 | Tanizawa et al. |
| 7,247,889 B2 | 7/2007 | Hanson et al. |
| 7,247,985 B2 | 7/2007 | Kaneko et al. |
| 7,262,436 B2 | 8/2007 | Kondoh et al. |
| 7,312,474 B2 | 12/2007 | Emerson et al. |
| 7,322,732 B2 | 1/2008 | Negley et al. |
| 7,323,764 B2 | 1/2008 | Wallis |
| 7,326,967 B2 | 2/2008 | Hsieh et al. |
| 7,327,036 B2 | 2/2008 | Borghs et al. |
| 7,335,920 B2 | 2/2008 | Denbaars et al. |
| 7,339,205 B2 | 3/2008 | Piner et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,547,925 B2 | 6/2009 | Wong et al. |
| 7,598,108 B2 | 10/2009 | Li et al. |
| 7,611,917 B2 | 11/2009 | Emerson et al. |
| 7,615,420 B2 | 11/2009 | Jiang et al. |
| 7,674,639 B2 | 3/2010 | Lester |
| 7,687,827 B2 | 3/2010 | Piner et al. |
| 7,691,651 B2 | 4/2010 | Park |
| 7,709,851 B2 | 5/2010 | Bader et al. |
| 7,737,459 B2 | 6/2010 | Edmond et al. |
| 7,754,514 B2 | 7/2010 | Yajima et al. |
| 7,781,356 B2 | 8/2010 | Kouvetakis et al. |
| 7,791,061 B2 | 9/2010 | Edmond et al. |
| 7,791,101 B2 | 9/2010 | Bergmann et al. |
| 7,791,106 B2 | 9/2010 | Piner et al. |
| 7,795,623 B2 | 9/2010 | Emerson et al. |
| 7,813,400 B2 | 10/2010 | Denbaars et al. |
| 7,821,024 B2 | 10/2010 | Jeong |
| 7,910,945 B2 | 3/2011 | Donofrio et al. |
| 7,928,471 B2 | 4/2011 | Mastro et al. |
| 7,939,844 B2 | 5/2011 | Hahn et al. |
| 7,947,994 B2 | 5/2011 | Tanizawa et al. |
| 7,968,865 B2 | 6/2011 | LaRoche et al. |
| 8,021,904 B2 | 9/2011 | Chitnis |
| 8,030,665 B2 | 10/2011 | Nagahama et al. |
| 2003/0178642 A1 | 9/2003 | Tanaka et al. |
| 2005/0106849 A1 | 5/2005 | Gwo |
| 2006/0006500 A1 | 1/2006 | Piner et al. |
| 2006/0246612 A1 | 11/2006 | Emerson |
| 2007/0114511 A1 | 5/2007 | Kim et al. |
| 2007/0210304 A1 | 9/2007 | Komiyama et al. |
| 2007/0295985 A1 | 12/2007 | Weeks, Jr. et al. |
| 2008/0014723 A1 | 1/2008 | Shibata |
| 2008/0200013 A1 | 8/2008 | Piner et al. |
| 2008/0230800 A1 | 9/2008 | Bandoh |
| 2008/0261403 A1 | 10/2008 | Wang et al. |
| 2009/0152578 A1 | 6/2009 | Lee |
| 2009/0261363 A1 | 10/2009 | Chen et al. |
| 2009/0321780 A1 | 12/2009 | Huang et al. |
| 2010/0019263 A1 | 1/2010 | Yeh et al. |
| 2010/0038669 A1 | 2/2010 | McKenzie |
| 2010/0166983 A1 | 7/2010 | Cho et al. |
| 2010/0176369 A2 | 7/2010 | Oliver et al. |
| 2010/0207097 A1 | 8/2010 | Oh |
| 2011/0003420 A1 | 1/2011 | Chen et al. |
| 2011/0012155 A1 | 1/2011 | Huang et al. |
| 2011/0049546 A1 | 3/2011 | Heikman et al. |
| 2011/0198564 A1 | 8/2011 | Son |
| 2011/0309327 A1* | 12/2011 | Jeong .............................. 257/13 |

FOREIGN PATENT DOCUMENTS

| | | |
|---|---|---|
| JP | 2681733 A | 5/1994 |
| JP | 2917742 A | 6/1994 |
| JP | 2827794 A | 8/1994 |
| JP | 2778405 A | 9/1994 |
| JP | 2803741 A | 9/1994 |
| JP | 2785254 A | 1/1995 |
| JP | 2956489 A | 3/1996 |
| JP | 2666237 A | 4/1996 |
| JP | 2735057 A | 9/1996 |
| JP | 8264894 | 10/1996 |
| JP | 2890396 A | 12/1996 |
| JP | 3250438 A | 12/1996 |
| JP | 3135041 A | 6/1997 |
| JP | 3209096 A | 12/1997 |
| JP | 3506874 A | 1/1998 |
| JP | 3654738 A | 2/1998 |
| JP | 3795624 A | 2/1998 |
| JP | 3304787 A | 5/1998 |
| JP | 3344257 A | 8/1998 |
| JP | 3223832 A | 9/1998 |
| JP | 3374737 A | 12/1998 |
| JP | 11040847 | 2/1999 |
| JP | 3314666 A | 3/1999 |
| JP | 4118370 A | 7/1999 |
| JP | 4118371 A | 7/1999 |
| JP | 3548442 A | 8/1999 |
| JP | 3622562 A | 11/1999 |
| JP | 3424629 A | 8/2000 |
| JP | 4860024 A | 8/2000 |
| JP | 3063756 A | 9/2000 |
| JP | 4629178 A | 9/2000 |
| JP | 3063757 A | 10/2000 |
| JP | 3511970 A | 10/2000 |
| JP | 3551101 A | 5/2001 |
| JP | 3427265 A | 6/2001 |
| JP | 3646649 A | 10/2001 |
| JP | 3780887 A | 5/2002 |
| JP | 3890930 A | 5/2002 |
| JP | 3786114 A | 4/2004 |
| JP | 3748011 | 2/2006 |
| JP | 4904261 B2 | 1/2012 |

OTHER PUBLICATIONS

Cooke, M. High-Brightness Nitride LEDs on Silicon Through Wafer Bonding. Available at http://www.semiconductor-today.com/news_items/2011/JUNE/KOREAPHOTONICS_040611.html. Accessed Nov. 8, 2011.

Dadgar, et al. Epitaxy of GaN on silicon—impact of symmetry and surface reconstruction. New Journal of Physics, vol. 9, No. 389 (2007); IOP Publishing Ltd., http://iopscience.iop.org/1367-2630/9/10/389.

Zang, et al. Structural analysis of metalorganic chemical vapor deposited AlN nucleation layers on Si(111). Singapore—MIT Alliance, Jan. 2004, citable URI:http://hdl.handle.net/1721.1/3841 (4 pages).

(56) References Cited

OTHER PUBLICATIONS

U.S. Appl. No. 13/248,821, filed Sep. 29, 2011, Ting.
U.S. Appl. No. 13/249,157, filed Sep. 29, 2011, Yang.
U.S. Appl. No. 13/249,184, filed Sep. 29, 2011, Yan.
U.S. Appl. No. 13/249,196, filed Sep. 29, 2011, Lin.
Arslan, et al. Buffer optimization for crack-free GaN epitaxial layers grown on Si(111) substrate by MOCVD. J. Phys. D: Appl. Phys. 2008; 41:155317-1-10.
Hageman, et al. Growth of GaN epilayers on Si(111) substrates using multiple buffer layers. Mat. Res. Soc. Symp. Proc. 2002; 693:1-6.
Hang, et al. Influence of an Advanced Buffer Layer on the Optical Properties of an InGaN/GaN MQW Grown on a (111) Silicon Substrate. J. Kor. Phys. Soc. Mar. 2007; 50(3):797-800.
Hangleiter, et al. Suppression of Nonradiative Recombination by V-Shaped Pits in GaInN/GaN Quantum Wells Produces a Large Increase in the Light Emission Efficiency. PRL. 2005; 95(12):127402-1-127402-4.
Hao, et al. Highly efficient GaN-based light emitting diodes with micropits. Appl. Phys. Letts. 2006; 89:241907-1-241907-3.
Hsu, et al. Crack-Free High-Brightness InGaN/GaN LEDs on Si(111) with Initial AlGaN Buffer and Two LT-Al Interlayers. J. Elec. Soc. 2007; 154:H191-H193.
Kim, et al. Light Extraction in GaInN Light-Emitting Diodes using Diffuse Omnidirectional Reflectors. J. Elec. Soc. 2006; 153(2):G105-G107.
Lee, et al. High brightness GaN-based light-emitting diodes. J. Display Tech. Jun. 2007; 3(2):118-125.
Li, et al. Growth of III-nitride photonic structures on large area silicon substrates. Appl. Phys. Letts. 2006; 88:171909-1-3.
Liang, et al. Synthesis and characterization of heteroepitaxial GaN films on Si(111). Vacuum. 2010; 84:1154-1158.
Lin, et al. Growth of GaN film on 150 mm Si (111) using multilayer AlN/AlGaN buffer by metal-organic vapor phase epitaxy method. Appl. Phys. Letts. 2007; 91:222111-1-3.
Pal, et al. Silicon a new substrate for GaN growth. Bull. Mater. Sci. Dec. 2004; 27(6):501-504.
Xi, et al. High Light-Extraction Efficiency in GaInN Light-Emitting Diode with Pyramid Reflector. Proc. of SPIE. 2007; 6486:648606-1-8.
Xiang, et al. High quality GaN epilayers grown on Si (111) with thin nonlinearly composition-graded $Al_xGa_{1-x}N$ interlayers via metal-organic chemical vapor deposition. Journal of Alloys and Compounds. 2011; 509:2227-2231.
Zhu, et al. GaN-based LEDs grown on 6-inch diameter Si (111) substrates by MOVPE. Proc. of SPIE. 2006; 7231:723118-1-11.
International Search Report, WO2013049416, Apr. 4, 2013, Corresponding PCT application.
Office action dated Dec. 17, 2012 for U.S. Appl. No. 13/248,821.

* cited by examiner

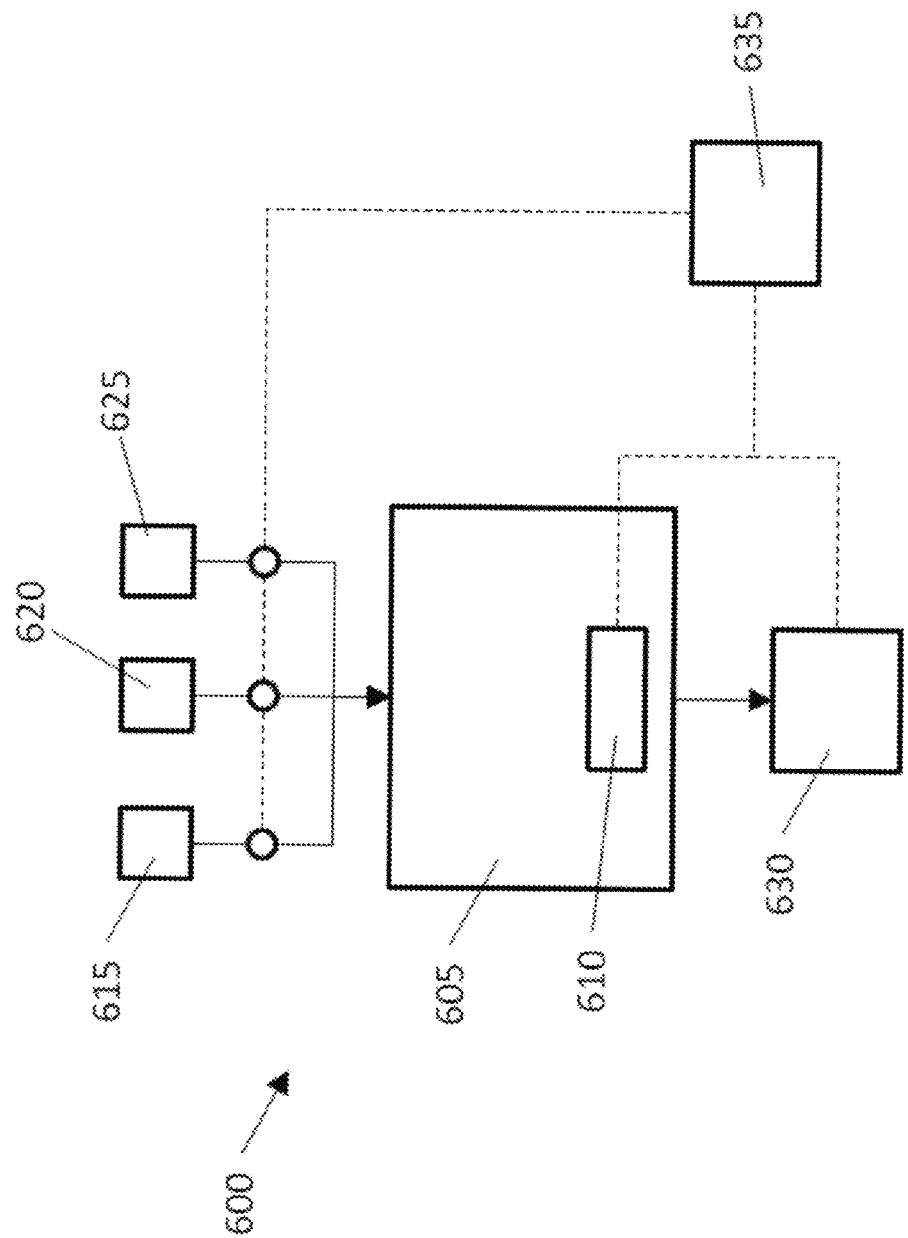

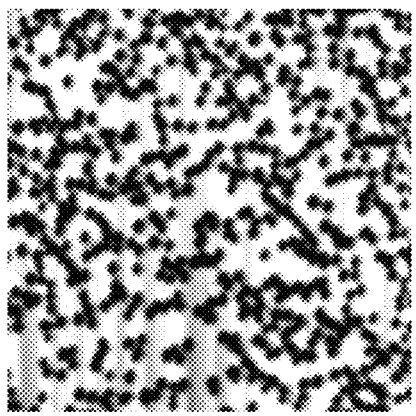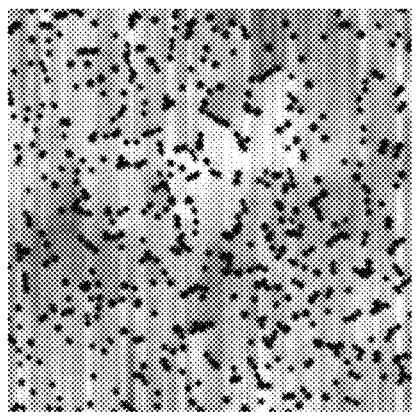
FIG. 7A
FIG. 7B

LIGHT EMITTING REGIONS FOR USE WITH LIGHT EMITTING DEVICES

BACKGROUND

Lighting applications typically use incandescent or gas-filled bulbs. Such bulbs typically do not have long operating lifetimes and thus require frequent replacement. Gas-filled tubes, such as fluorescent or neon tubes, may have longer lifetimes, but operate using high voltages and are relatively expensive. Further, both bulbs and gas-filled tubes consume substantial amounts of energy.

A light emitting diode (LED) is a device that emits light upon the application of an electrical potential across an active layer of the LED. An LED typically includes a chip of semiconducting material doped with impurities to create a p-n junction. Current flows from the p-side, or anode, to the n-side, or cathode. Charge-carriers—electrons and holes—flow into the p-n junction from electrodes with different voltages. When an electron meets a hole, the electron recombines with the hole in a process that may result in the radiative emission of energy in the form of one or more photons (hv). The photons, or light, are transmitted out of the LED and employed for use in various applications, such as, for example, lighting applications and electronics applications.

LED's, in contrast to incandescent or gas-filled bulbs, are relatively inexpensive, operate at low voltages, and have long operating lifetimes. Additionally, LED's consume relatively little power and are compact. These attributes make LED's particularly desirable and well suited for many applications.

Despite the advantages of LED's, there are limitations associated with such devices. Such limitations include materials limitations, which may limit the efficiency of LED's; structural limitations, which may limit transmission of light generated by an LED out of the device; and manufacturing limitations, which may lead to high processing costs. Accordingly, there is a need for improved LED's and methods for manufacturing LED's.

SUMMARY

In an aspect of the invention, light emitting devices, such as light emitting diodes, are provided. In an embodiment, a light emitting diode includes a first layer, which includes an n-type Group III-V semiconductor and a second layer adjacent to the first layer, the second layer including an active material that generates light upon the recombination of electrons and holes. A third layer is adjacent to the second layer, the third layer including a p-type Group III-V semiconductor. A silicon substrate is adjacent to one of the first layer and the third layer. The active material includes one or more V-pits having one or more openings at an interface between the active layer and the third layer. The V-pits have a density between about 1 V-pit/$\mu m^2$ and 30 V-pits/$\mu m^2$. The density in some situations is a surface density.

In another embodiment, a light emitting diode includes a first layer having an n-type Group III-V semiconductor and a second layer adjacent to the first layer, the second layer including an active material that generates light upon the recombination of electrons and holes. The second layer includes one or more V-pits at a coverage between about 5% and 30%. A third layer is disposed adjacent to the second layer. The third layer includes a p-type Group III-V semiconductor.

In another embodiment, a light emitting diode includes an n-type gallium nitride (GaN) layer, a p-type GaN layer, and an active layer between the n-type GaN layer and the p-type GaN layer. The active layer includes one or more V-pits having one or more openings at an interface between the active layer and the n-type GaN layer or the p-type GaN layer. The one or more openings consume between about 5% and 30% of the area at the interface. The interface may be a surface of the active layer adjacent to the n-type GaN layer or the p-type GaN layer.

In another aspect of the invention, active layers for use in light emitting devices, such as LED's, are provided. In an embodiment, an active layer for use in a light emitting diode includes a light emitting material having a thickness less than about 500 nanometers and one or more V-pits at coverage between about 5% and 30%.

In another embodiment, an active layer for use in a light emitting diode includes a light emitting material having a thickness less than about 500 nanometers and one or more V-pits having one or more openings at a surface of the active layer. The one or more V-pits have a density between about 1 V-pit/$\mu m^2$ and 30 V-pits/$\mu m^2$.

In another aspect of the invention, methods for forming light emitting devices, such as LED's, are provided. In an embodiment, a method for forming a light emitting diode includes forming an n-type or p-type Group III-V semiconductor layer adjacent to an active layer. The active layer is formed by exposing a substrate to a Group III precursor and a Group V precursor at one or more growth conditions selected to generate one or more V-pits in the active layer. The one or more V-pits are formed to have one or more openings at a surface of the active layer at a density between about 1 V-pit/$\mu m^2$ and 30 V-pits/$\mu m^2$.

In another embodiment, a method for forming a light emitting diode includes forming an active layer by exposing a substrate in a reaction chamber (or reaction space if the reaction chamber includes a plurality of reaction spaces) to a Group III precursor and a Group V precursor to form an active layer having one or more V-pits at a density between about 1 V-pit/$\mu m^2$ and 30 V-pits/$\mu m^2$, wherein, during the formation of the active layer: i) the temperature of the substrate is between about 750° C. and 850° C.; and/or ii) the flow rate of hydrogen ($H_2$) into the reaction chamber is less than or equal to about 20 liters/minute.

In another embodiment, a method for forming a light emitting diode includes providing a substrate in a reaction chamber and forming a quantum well layer adjacent to the substrate by directing into the reaction chamber a Group III precursor and a Group V precursor. The well layer is formed at a growth temperature between about 750° C. and 790° C. A barrier layer is then formed adjacent to the well layer by directing into the reaction chamber the Group III precursor and the Group V precursor. The barrier layer is formed at a growth temperature between about 790° C. and 850° C. The quantum well layer is formed with an acceptor material or, alternatively, the barrier layer is formed with a donor material.

In another embodiment, a method for forming a light emitting diode includes providing a substrate in a reaction chamber. The substrate is heated at a first temperature between about 750° C. and 790° C. Next, a well layer is formed by directing into the reaction chamber a Group III precursor and a Group V precursor. The well layer is formed at a first carrier gas flow rate. The substrate is then heated at a temperature between about 790° C. and 850° C. Next, a barrier layer is formed adjacent to the well layer by directing into the reaction chamber the Group III precursor and the Group V precursor. The barrier layer is formed at a second carrier gas flow rate. In some situations, the first carrier gas flow rate is less than the second carrier gas flow rate.

In another aspect of the invention, systems for forming light emitting devices, such as LED's, are provided. In an embodiment, a system for forming a light emitting device includes a reaction chamber for holding a substrate and a pumping system in fluid communication with the reaction chamber. The pumping system is configured to purge or evacuate the reaction chamber. The system includes a computer system having a processor for executing machine readable code implementing a method for forming an active layer. The method includes forming an active layer by exposing the substrate in the reaction chamber to a Group III precursor and a Group V precursor to form an active layer having one or more V-pits at a coverage between about 5% and 30%. During the formation of the active layer, i) the temperature of the substrate is between about 750° C. and 850° C., and/or ii) the flow rate of hydrogen ($H_2$) into the reaction chamber is less than or equal to about 20 liters/minute.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which:

FIG. 6 schematically illustrates a system for forming a light emitting device, in accordance with an embodiment; and FIGS. 7A and 7B show atomic force microscopy (AFM) micrographs of the top surfaces of active layers.

DETAILED DESCRIPTION

Figure 1:
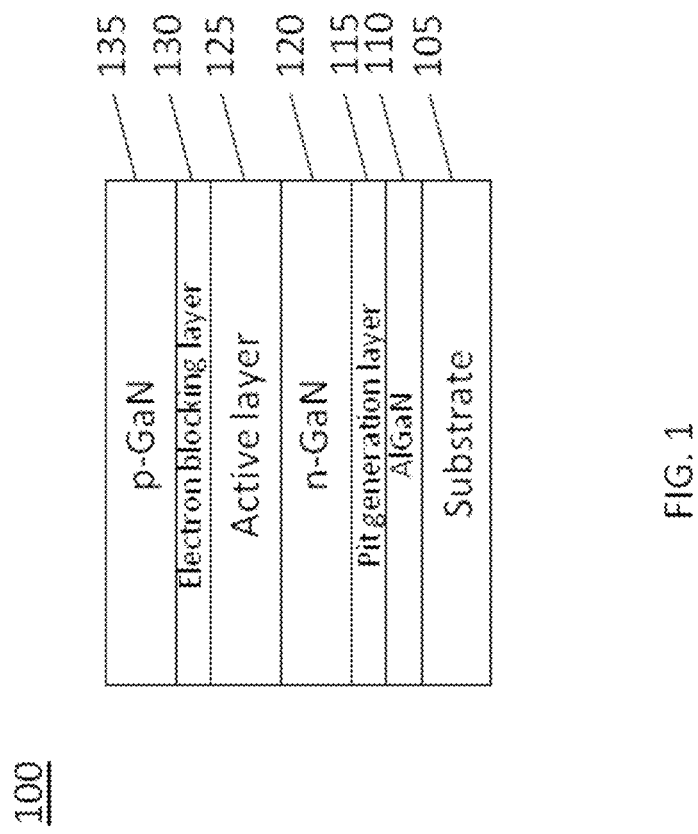
FIG. 1 schematically illustrates a light emitting diode.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

The term "light emitting device," as used herein, refers to a device configured to generate light upon the recombination of electrons and holes in a light emitting region (or "active layer") of the device. A light emitting device in some cases is a solid state device that converts electrical energy to light. A light emitting diode ("LED") is a light emitting device. There are many different LED device structures that are made of different materials and have different structures and perform in a variety of ways. Some LED's emit laser light, and others generate non-monochromatic light. Some LED's are optimized for performance in particular applications. An LED may be a so-called blue LED including a multiple quantum well (MQW) active layer having indium gallium nitride. A blue LED may emit non-monochromatic light having a wavelength in a range from about 440 nanometers to 500 nanometers while having an average current density of 38 amperes per square centimeter or more. A phosphor coating may be provided that absorbs some of the emitted blue light. The phosphor in turn fluoresces to emit light of other wavelengths so that the light the overall LED device emits has a wider range of wavelengths.

The term "layer," as used herein, refers to a layer of atoms or molecules on a substrate. In some cases, a layer includes an epitaxial layer or a plurality of epitaxial layers (or sub-layers). A layer may include a film or thin film. In some situations, a layer is a structural component of a device (e.g., light emitting diode) serving a predetermined device function, such as, for example, an active layer that generates (or emits) light. A layer generally has a thickness from about one monoatomic monolayer (ML) to tens of monolayers, hundreds of monolayers, thousands of monolayers, millions of monolayers, billions of monolayers, trillions of monolayers, or more. In an example, a layer is a multilayer structure having a thickness greater than one monoatomic monolayer. In addition, a layer may include multiple material layers. In an example, a multiple quantum well active layer includes multiple well and barrier layers.

The term "coverage," as used herein, refers to the fraction of a surface or interface covered or occupied by a species in relation to the total area of the surface. For example, a coverage of 10% for a species indicates that 10% of a surface is covered by the species. In some situations, coverage is represented by monolayers (ML), with 1 ML corresponding to complete saturation of a surface with a particular species. For example, a pit coverage of 0.1 ML indicates that 10% of a surface is occupied by the openings of pits (or holes). The coverage refers to the surface coverage of such openings (or holes). In an example, for a surface or interface having between about 5% and 30% openings, between about 5% and 30% of the area of the surface or interface is consumed by the openings. In such a case, the opening can be filled by a material, including, but not limited to, a semiconductor material.

The term "active region" (or "active layer"), as used herein, refers to a light emitting region of a light emitting diode (LED) that generates light. An active layer includes an active material that generates light upon the recombination of electrons and holes, such as, for example, with the aid of an electrical potential applied across the active layer. An active layer may include one or a plurality of layers (or sub-layers). In some cases, an active layer includes one or more barrier layers (or cladding layers, such as, e.g., GaN) and one or more quantum well ("well") layers (such as, e.g., InGaN). In an example, an active layer includes multiple quantum wells, in which case the active layer may be referred to as a multiple quantum well ("MQW") active layer.

The term "doped," as used herein, refers to a structure or layer that is chemically doped. A layer may be doped with an n-type chemical dopant (also "n-doped" herein) or a p-type chemical dopant (also "p-doped" herein). In some cases, a layer is undoped or unintentionally doped (also "u-doped" or "u-type" herein). In an example, a u-GaN (or u-type GaN) layer includes undoped or unintentionally doped GaN.

The term "dopant," as used herein, refers to a chemical dopant, such as an n-type dopant or a p-type dopant. P-type dopants include, without limitation, boron, aluminum, magnesium, beryllium, zinc and carbon. N-type dopants include, without limitation, nitrogen, phosphorous, silicon, germanium, tin, tellurium and selenium. A p-type semiconductor is a semiconductor that is doped with a p-type dopant. An n-type semiconductor is a semiconductor that is doped with an n-type dopant. An n-type Group III-V material, such as n-type gallium nitride ("n-GaN"), includes a Group III-V material that is doped with an n-type dopant. A p-type Group III-V material, such as p-type GaN ("p-GaN"), includes a Group III-V material that is doped with a p-type dopant. A Group III-V material includes at least one Group III element selected from boron, aluminum, gallium, indium, and thallium, and at least one Group V element selected from nitrogen, phosphorus, arsenic, antimony and bismuth.

The term "adjacent" or "adjacent to," as used herein, includes 'next to', 'adjoining', 'in contact with', and 'in proximity to'. In some instances, adjacent components are separated from one another by one or more intervening layers. For example, the one or more intervening layers can have a thickness less than about 10 micrometers ("microns"), 1 micron, 500 nanometers ("nm"), 100 nm, 50 nm, 10 nm, 1 nm, or less. In an example, a first layer is adjacent to a second layer when the first layer is in direct contact with the second layer. In another example, a first layer is adjacent to a second layer when the first layer is separated from the second layer by a third layer.

The term "substrate," as used herein, refers to any workpiece on which film or thin film formation is desired. A substrate includes, without limitation, silicon, silica, sapphire, zinc oxide, carbon (e.g., graphene), SiC, AlN, GaN, spinel, coated silicon, silicon on oxide, silicon carbide on oxide, glass, gallium nitride, indium nitride, titanium dioxide, aluminum nitride, a metallic material (e.g., molybdenum, tungsten, copper, aluminum), and combinations (or alloys) thereof.

The term "surface," as used herein, refers to the boundary between a first phase and a second phase, such as the boundary between solid phases or the boundary between a solid phase and a gas phase. In an example, a surface is at an interface between a first layer and a second layer. The surface may be covered by a material layer. In some embodiments, a surface (or interface) includes openings, such as openings of V-pits. In some situations, the openings are filled with one or more materials.

The term "injection efficiency," as used herein, refers to the proportion of electrons passing through a light emitting device that are injected into the active region of the light emitting device.

The term "internal quantum efficiency," as used herein, refers to the proportion of all electron-hole recombination events in an active region of a light emitting device that are radiative (i.e., producing photons).

The term "extraction efficiency," as used herein, refers to the proportion of photons generated in an active region of a light emitting device that escape from the device.

The term "external quantum efficiency" (EQE), as used herein, refers to the ratio of the number of photons emitted from an LED to the number of electrons passing through the LED. That is, EQE=Injection efficiency×Internal quantum efficiency×Extraction efficiency.

LED's may be formed of various semiconductor device layers. In some situations, Group III-V semiconductor LED's offer device parameters (e.g., wavelength of light, external quantum efficiency) that may be preferable over other semiconductor materials. Gallium nitride (GaN) is a binary Group III-V direct bandgap semiconductor that may be used in optoelectronic applications and high-power and high-frequency devices.

Group III-V semiconductor based LED's may be formed on various substrates, such as silicon and sapphire. Silicon provides various advantages over other substrates, such as the capability of using current manufacturing and processing techniques, in addition to using large wafer sizes that aid in maximizing the number of LED's formed within a predetermined period of time. FIG. 1 shows an LED 100 having a substrate 105, an AlGaN layer 110 adjacent to the substrate 105, pit generation layer 115 adjacent to the AlGaN layer 110, an n-type GaN ("n-GaN") layer 120 adjacent to the pit generation layer 115, an active layer 125 adjacent to the n-GaN layer 120, an electron blocking (e.g., AlGaN) layer 130 adjacent to the active layer 125, and a p-type GaN ("p-GaN") layer 135 adjacent to the electron blocking layer 130. The electron blocking layer 130 minimizes the recombination of electrons with holes in the p-GaN layer 135. The substrate 100 may be formed of silicon. In some cases, the pit generation layer 115 comprises unintentionally doped GaN ("u-GaN").

While silicon provides various advantages, such as the ability to use commercially available semiconductor fabrication techniques adapted for use with silicon, the formation of a Group III-V semiconductor-based LED on a silicon substrate poses various limitations. As an example, the lattice mismatch and coefficient of thermal expansion between silicon and gallium nitride leads to structural stresses that generate defects upon the formation of gallium nitride thin films, such as threading and/or hairpin dislocations (collectively "dislocations" herein). Thin film growth around the defects produces V-defects (or V-pits), which are V-shaped or generally concave structures in device layers. Such V-pits make it difficult to achieve uniform device properties, such as the distribution of chemical dopants ("dopants") in one or more layers.

An approach for addressing such issues is to minimize the concentration of V-pits in the LED. For example, the active layer may be formed with low or substantially low defect densities, which may aid in minimizing the coverage (or density) of V-pits. Such an approach, however, may be commercially infeasible and/or difficult to implement with methods currently available for forming LED's. For instance, the formation of LED component layers (e.g., active layer) at low defect densities may be a slow and resource intensive process, leading to high processing costs and inadequate device turnover to meet the commercial demand for LED devices. For example, forming GaN on silicon typically requires a relatively thick layer of GaN, which may be grown using multiple layers of AlN or $SiN_x$ to reduce the dislocation density at the AlN/GaN or SiNx/GaN interface. This makes the run time long, thereby increasing cost, and also makes elimination of cracking difficult due to the thicker GaN layers required. It is typically difficult to form GaN layers on silicon substrates to form light emitting devices having efficiencies comparable to those of GaN layers on sapphire substrates.

In some embodiments, methods are provided for growing an LED active region over silicon such that high light output efficiencies may be achieved even with relatively high dislocation densities. In some situations, methods provided herein advantageously eliminate the need for forming n-GaN layers and active layers with low dislocation densities, such as substantially less than $1\times10^9$ cm$^{-2}$, in order to obtain LED's with high light output efficiencies. Methods provided herein may be used with GaN layers having thicknesses less than 2 μm. In some embodiments, for an active layer formed over an n-GaN layer, which is formed over a silicon substrate, the active layer and n-GaN layer have dislocation densities between about $1\times10^8$ cm$^{-2}$ and $5\times10^9$ cm$^{-2}$. In other embodiments, the active layer and n-GaN layer have dislocation densities between about $1\times10^9$ cm$^{-2}$ and $2\times10^9$ cm$^{-2}$. LED's having active layers formed over silicon substrates according to methods provided herein emit light at light output efficiencies similar to, or in some cases exceeding that of, active layers formed over sapphire substrates.

Provided herein are device structures and methods for forming active layers for light emitting devices in a manner preferable for moderate to high defect densities. Methods provided herein advantageously enable the formation of light emitting devices with desirable device properties without the need for minimizing defect densities. Methods described in some embodiments of the invention are based on the unexpected realization that light emitting devices having active layers with moderate to high defect densities may be formed having preferable device performance characteristics by selecting various process parameters during active layer formation to achieve certain V-pit densities and coverages.

Light Emitting Devices

In an aspect of the invention, light emitting device structures formed of active layers with relatively moderate to high defect densities are provided. In some situations, such active layers have defect densities between about $1\times10^8$ cm$^{-2}$ and $5\times10^9$ cm$^{-2}$. In other embodiments, such active layers have defect densities between about $1\times10^9$ cm$^{-2}$ and $2\times10^9$ cm$^{-2}$. Device structures described in some embodiments preclude the need to form light emitting device structures with minimal defect densities. With the aid of V-pit densities, distributions and/or coverages provided herein, active layers with relatively moderate to high defect densities (and hence V-pits) may be used, which advantageously reduces processing costs and helps provide for the wide scale use of silicon-based LED's in a commercial setting.

In some embodiments, a light emitting device, such as a light emitting diode (LED), includes a first layer, which includes an n-type Group III-V semiconductor, and a second layer over the first layer. The second layer includes an active material that generates light upon the recombination of electrons and holes. The light emitting device further includes a third layer over the second layer. The third layer includes a p-type Group III-V semiconductor. In an embodiment, the n-type Group III-V semiconductor is n-type gallium nitride (n-GaN) and the p-type Group III-V semiconductor is p-type gallium nitride (GaN)—i.e., GaN doped with an n-type and p-type dopant, respectively.

The Group III-V semiconductor includes a Group III species and a Group V species. In some embodiments, the Group III species is gallium and the Group V species is nitrogen. In other embodiments, the Group III species includes gallium and/or indium.

The active material includes one or more V-pits that have one or more openings at a surface of the active material. In some embodiments, the density of the V-pits is between about 1 V-pit/μm$^2$ and 30 V-pits/μm$^2$, or between about 10 V-pits/ μm$^2$ and 20 V-pits/μm$^2$. The V-pit density (or coverage) may be as measured by a surface spectroscopy technique, such as atomic force microscopy (AFM) or scanning tunneling microscopy (STM). In such a case, the density (or coverage) of openings (or holes) of V-pits at the surface of the second (active) layer corresponds to the density of V-pits in the second layer. In another embodiment, the active material includes one or more V-pits at a density between about 50 V-pits and 500 V-pits in a 25 μm$^2$ area, or between about 200 V-pits and 400 V-pits in a 25 μm$^2$ area, based on a measurement of the density (e.g., surface density) of openings (or holes) at the surface of the second layer. The density in some cases corresponds to the coverage of holes (or openings) on a surface of the second layer. In another embodiment, the active material includes one or more V-pits at a coverage (e.g., surface coverage) between about 5% and 30%, or between about 10% and 20%. In another embodiment, the active material includes one or more V-pits at a surface coverage between about 0.05 monolayers (ML) and 0.4 ML, or between about 0.1 ML and 0.2 ML.

In some situations, the holes are disposed on a surface of the second layer adjacent to the first layer. In other situations, the holes are disposed on a surface of the second layer adjacent to the third layer.

The active material in some cases has a dislocation density between about $1\times10^8$ cm$^{-2}$ and $5\times10^9$ cm$^{-2}$, or between about $1\times10^9$ cm$^{-2}$ and $2\times10^9$ cm$^{-2}$ (i.e., the number of dislocations in a 1 cm$^2$ cross-sectional area of the active material). In other cases, the active material has a dislocation density greater than or equal to about $1\times10^5$ cm$^{-2}$, or greater than or equal to about $1\times10^6$ cm$^{-2}$, or greater than or equal to about $1\times10^7$ cm$^{-2}$, or greater than or equal to about $1\times10^8$ cm$^{-2}$, or greater than or equal to about $1\times10^9$ cm$^{-2}$, or greater than or equal to about $2\times10^9$ cm$^{-2}$.

In some situations, the active layer has a thickness less than about 1000 nanometers (nm), or less than about 500 nm, or less than about 400 nm, or less than about 300 nm, or less than about 200 nm. In an example, the active layer has a thickness between about 100 nm and 200 nm.

In some embodiments, the first layer has a thickness between about 100 nm and 8 micrometers ("microns"), or between about 500 nm and 6 microns, or between about 1 micron and 4 microns. The thickness of the first layer may be selected so as to provide a light emitting device having predetermined operating conditions. In an embodiment, the n-type dopant includes one or more of silicon, germanium, tellurium, selenium and tin. In a particular implementation, the n-type dopant is silicon.

In some embodiments, the third layer has a thickness between about 10 nm and 1000 nm, or between about 20 nm and 800 nm, or between about 50 nm and 500 nm. The thickness of the third layer may be selected so as to provide a light emitting device having predetermined operating conditions. In an embodiment, the p-type dopant includes one or more of magnesium, carbon and beryllium. In a particular implementation, the p-type dopant is magnesium.

The light emitting device further includes a substrate below the first layer or above the third layer. In an example, the substrate includes silicon or sapphire, such as an n-type silicon substrate. In some cases, the substrate is for use in the completed light emitting device. In other cases, the substrate is a carrier substrate; the completed light emitting device in such cases will include another substrate. In some embodiments, the substrate has a thickness between about 100 μm and 200 μm.

In some embodiments, the light emitting device includes a pit generation layer. In some cases, the pit generation layer is adjacent to the first layer, such as below the first and second layers. In other cases, the pit generation layer is between the first layer and the second layer. The pit generation layer aids in the growth of the one or more V-pits during the formation of the second layer and, in some cases, other layers formed over the second layer.

In some cases, the pit generation layer has a defect density between about $1\times10^8$ cm$^{-2}$ and $5\times10^9$ cm$^{-2}$. In other embodiments, the pit generation layer has a defect density between about $1\times10^9$ cm$^{-2}$ and $2\times10^9$ cm$^{-2}$. In some embodiments, the pit generation layer has a thickness between about 10 nm and 1000 nm, whereas in other embodiments, the pit generation layer has a thickness between about 50 nm and 500 nm.

The light emitting device includes an electrode in electrical communication with the first layer by direct contact with the first layer or through one or more intervening layers. The light emitting device further includes an electrode in electrical communication with the third layer by direct contact with the third layer or through one or more intervening layers. In some cases, one or both of the electrodes have shapes and configurations selected to minimize the obstruction of light emanating from the light emitting device.

In some embodiments, the active material of the second layer is a quantum well active material, such as a multiple quantum well (MQW) material. In an embodiment, the second layer includes alternating well layers and barrier (or cladding) layers. In an example, the second layer includes a well layer formed of indium gallium nitride and/or indium aluminum gallium nitride. In such a case, the barrier layer may be formed of gallium nitride. In another example, the second layer includes a well layer formed of aluminum gallium nitride. In such a case, the barrier layer may be formed of aluminum nitride or gallium nitride. The material, which includes the active layer may be compositionally graded (also "graded" herein) in two or more elements including the active layer. In an example, the second layer includes graded indium gallium nitride, $In_xGa_{1-x}N$, wherein 'x' is a number between 0 and 1, and a barrier (or cladding) layer formed of GaN. The composition of such a layer may vary from a first side to a second side of the second layer. In some situations, a well layer includes an acceptor material and/or a barrier layer includes a donor material. In some embodiments, barrier materials include one or more of gallium nitride, aluminum gallium nitride and indium gallium aluminum nitride; well materials include one or more of indium gallium nitride and indium aluminum gallium nitride. The stoichiometry of each of the well and barrier layers is selectable to achieve a predetermined device performance, such as the frequency of light emitted by the active layer.

In some embodiments, the second layer (including the active material) has a defect density between about $1\times10^8$ cm$^{-2}$ and $5\times10^9$ cm$^{-2}$, or between about $1\times10^9$ cm$^{-2}$ and $2\times10^9$ cm$^{-2}$. The second layer may have a thickness between about 10 nm and 1000 nm, or between about 50 nm and 200 nm.

In some embodiments, the thickness of the light emitting device between the first layer and the second layer is less than about 5 microns, or less than about 4 microns, or less than about 3 microns, or less than about 2 microns, or less than about 1 micron, or less than about 500 nm.

In some embodiments, the light emitting device has an external quantum efficiency of at least about 40%, or at least about 50%, or at least about 60%, or at least about 65%, or at least about 70%, or at least about 75%, or at least about 80%, or at least about 85%, or at least about 90%, or at least about 95% at a drive current of about 350 mA. In some embodiments, the light emitting device has an internal quantum efficiency of at least about 40%, or at least about 50%, or at least about 60%, or at least about 65%, or at least about 70%, or at least about 75%, or at least about 80%, or at least about 85%, or at least about 90%, or at least about 95%. In some embodiments, the light emitting device has a low forward voltage of about 2.85 V at 350 mA; a low reverse leakage current at −5V of less than about 0.01 µA; and a wall plug efficiency greater than about 55%.

In some embodiments, an active layer for use in a light emitting diode (LED) includes a light emitting material having a thickness less than about 500 nanometers and one or more V-pits at a surface density between about 1 V-pit/µm$^2$ and 30 V-pits/µm$^2$. In an embodiment, the surface density of the one or more V-pits is between about 10 V-pits/µm$^2$ and 20 V-pits/µm$^2$. The active layer has a dislocation density between about $1\times10^8$ cm$^{-2}$ and $5\times10^9$ cm$^{-2}$, or between about $1\times10^9$ cm$^{-2}$ and $2\times10^9$ cm$^{-2}$. In some cases, the active layer includes one or more layers of a Group III-V material.

In an example, the active layer is a quantum well active layer having a well layer and a barrier layer. The active layer may be a multiple quantum well active layer having a plurality of well layers and at least one barrier layer, or a plurality of barrier layers and at least one well layer. In some cases, the active layer is formed of a well layer having indium gallium nitride or aluminum gallium nitride and one or more barrier layers having gallium nitride or aluminum nitride. The barrier and well layers are provided in an alternating and sequential fashion, i.e., a barrier layer separating adjacent to well layers, or a well layer separating adjacent to barrier layers.

For instance, the active layer includes a well layer and a barrier layer adjacent to the well layer. The active layer may further include an additional barrier layer adjacent to the well layer or an additional well layer adjacent to the barrier layer. Such structures may be repeated to form an active layer with any desired number (or periods) of well-barrier stacks, with an individual stack having a well layer adjacent to a barrier layer. In some embodiments, the active layer includes at least one period, or at least 5 periods, or at least 10 periods, or at least 20 periods, or at least 30 periods, or at least 40 periods, or at least 50 periods, or at least 60 periods, or at least 70 periods, or at least 80 periods, or at least 90 periods, or at least 100 periods.

In some situations, a well layer is thinner than a barrier layer. In an example, an InGaN well layer has a thickness between about 1 nm and 20 nm, or 2 nm and 10 nm, and a GaN barrier layer has a thickness between about 5 nm and 30 nm, or 10 nm and 20 nm. In such a case, the barrier layer may be disposed between well layers, or a well layer may be disposed between two barrier layers.

In some embodiments, an active layer for use in a light emitting device, such as an LED, includes a light emitting material having a thickness less than about 500 nm, or less than about 400 nm, or less than about 300 nm, or less than about 200 nm. The active layer has one or more V-pits at surface coverage between about 5% and 30%. In some cases, the surface coverage is between about 10% and 20%.

In an example, an LED includes an n-type gallium nitride (GaN) layer, a p-type GaN layer, and an active layer between the n-type GaN layer and the p-type GaN layer, the active layer having one or more V-pits at a surface density between about 5% and 30%. The LED has a substrate adjacent to the n-type GaN layer or p-type GaN layer. The substrate is in contact with either the n-GaN layer or the p-GaN layer, or adjacent to the n-GaN layer or p-GaN layer but separated from the n-GaN layer or p-GaN by one or more intervening layers. The substrate may be formed of sapphire or silicon (e.g., n-type silicon). The active layer, in some cases, includes one or more quantum well stacks. Each of the quantum well stacks includes a barrier layer and a well layer adjacent to the barrier layer. The active layer has a thickness less than about 500 nm, or less than about 400 nm, or less than about 300 nm, or less than about 200 nm.

In some embodiments, the performance of a light emitting device depends on the thickness of the active layer and the distribution (or coverage) of V-pits on a surface of the active layer. In some situations, the performance of a light emitting device can be optimized by selecting a thickness of the active layer that gives a predetermined distribution and/or coverage of V-pits during active layer (epitaxial) growth. In an example, for a light emitting device having a dislocation density between about $1 \times 10^9$ cm$^{-2}$ and $2 \times 10^9$ cm$^{-2}$, an active layer having a thickness between about 50 nm and 200 nm provides a V-pit coverage that is between about 10% and 20%. The performance of such a device (e.g., external quantum efficiency) may be preferable in relation to a device having a thicker active layer or V-pit surface coverage below 10% or above 20%. For instance, an active layer having a thickness of about 150 nm and a V-pit surface coverage of about 10% has a light output efficiency that is increased by at least about 40% in relation to a device having an active layer with a thickness of about 300 nm and a V-pit coverage of 30%. The V-pit coverage for a particular active layer thickness may be a function of growth conditions of the active layer (see below).

Figure 2:
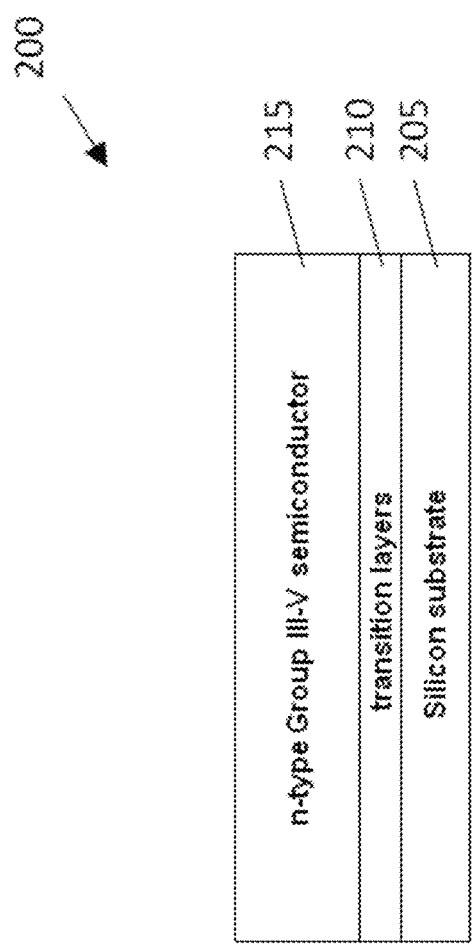
FIG. 2 schematically illustrates an n-type Group III-V semiconductor layer over a silicon substrate, in accordance with an embodiment.

FIG. 2 shows a device 200 having a silicon substrate 205, one or more transition layers 210 on the silicon substrate 205, and an n-type Group III-V semiconductor layer 215 on the one or more transition layers, in accordance with an embodiment. In some cases, the one or more transition layers include one or more u-type Group III-V semiconductor (i.e., an undoped or unintentionally doped Group III-V semiconductor, such as, e.g., unintentionally doped GaN) layers and/or one or more strain relaxation layers, such as a doped Group III-V semiconductor layer (e.g., aluminum gallium nitride) with a lattice constant between the silicon substrate 205 and the n-type Group III-V semiconductor layer 215. For example, the one or more transition layers 210 include an AlGaN layer and a u-GaN layer over the AlGaN layer, the u-GaN layer disposed adjacent to the n-type Group III-V semiconductor layer. In some embodiments, the Group III-V semiconductor material is gallium nitride (GaN). In such cases, the n-type Group III-V layer 215 includes n-type gallium nitride (n-GaN). The n-type Group III-V layer includes an n-type dopant, such as, for example, silicon.

In an example, the silicon substrate 205 has a (111) crystallographic orientation (i.e., the silicon substrate is Si(111)). In other examples, the silicon substrate 205 has other crystallographic orientations. The silicon substrate 205 may have facets and defects (e.g., steps) exhibiting one or more other crystallographic planes, such as, for example, a (100) crystallographic plane. In some cases, a substrate having a (111)-oriented surface has defects (e.g., steps) exhibiting other orientations.

Figure 3:
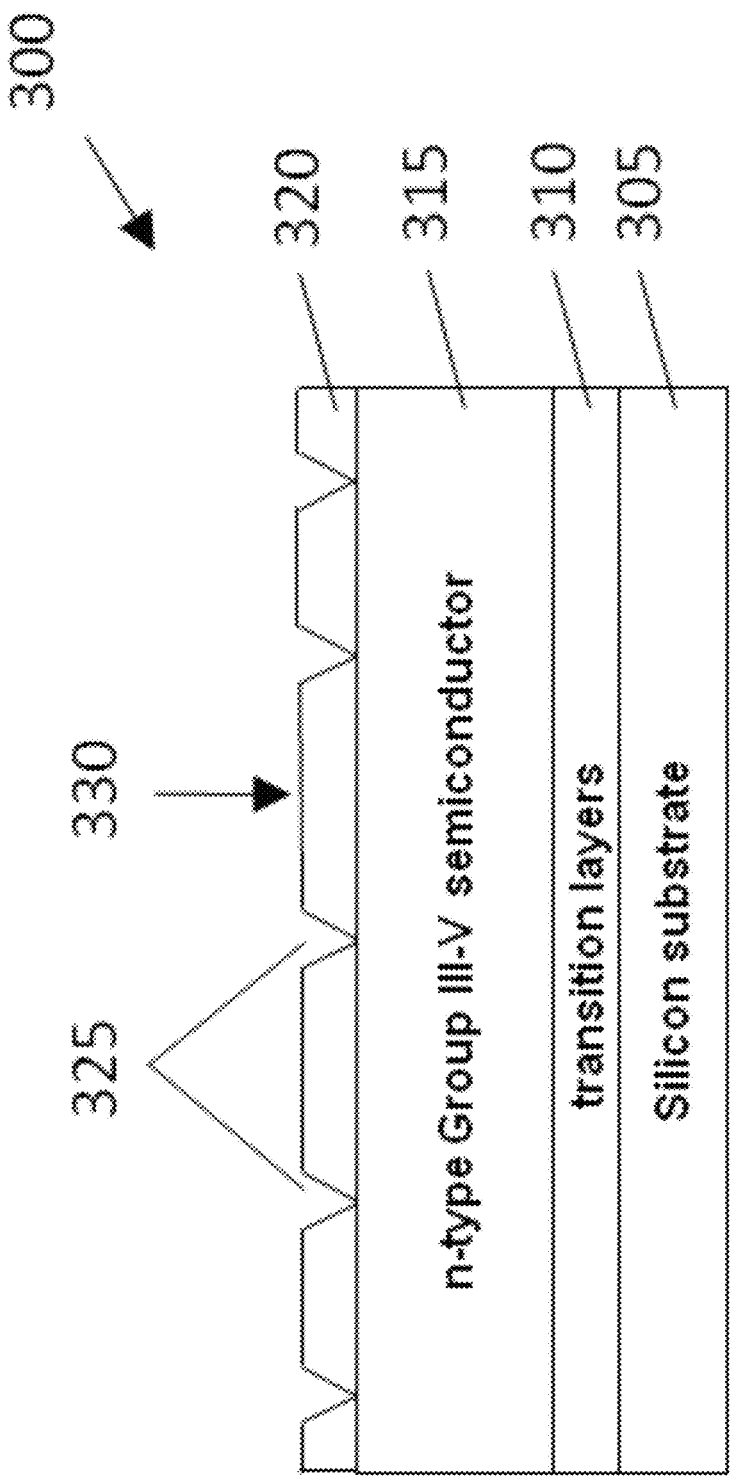
FIG. 3 schematically illustrates an active layer formed over a Group III-V semiconductor layer, in accordance with an embodiment.

FIG. 3 shows a device 300 having a silicon substrate 305, one or more transition layers 310 on the silicon substrate 305, an n-type Group III-V semiconductor layer 315 on the one or more transition layers, and an active layer 320 on the n-type Group III-V semiconductor layer, in accordance with an embodiment of the invention. The active layer 320 generates light upon the recombination of electrons and holes, such as, for example, upon the application of an electrical potential (voltage) across the active layer 320 with the aid of contacts or electrodes in electrical communication with the n-type Group III-V layer 315 and a p-type Group III-V layer (see, e.g., FIG. 1) over the active layer 320. The one or more transition layer 310 may be as described above in the context of FIG. 2.

In some situations, the active layer 320 includes one or more quantum wells and barrier layers. In an example, the active layer 320 is formed of a MQW material. For instance, the active layer 320 may be formed of one or more aluminum gallium nitride (AlGaN) quantum well layers and an aluminum nitride (AlN) well layer separating the one or more AlGaN quantum well layers. The active layer 320 may have a defect density between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$.

The active layer 320 of the device 300 includes a plurality of V-pits 325 extending from the n-type Group III-V semiconductor layer 315 to a top surface 330 of the active layer 320. The V-pits (or V-defects) are formed on or around defects (e.g., dislocations) in the n-type Group III-V semiconductor layer 315.

In some situations, the density of V-pits at the top surface 330 of the active layer 320, as measured by the density of openings (or holes) of the V-pits at a surface of the active layer 320, is between about 1 V-pit/μm$^2$ and 30 V-pits/μm$^2$, or between about 10 V-pits/μm$^2$ and 20 V-pits/μm$^2$. In some cases, the active layer 320 has between about 50 V-pits and 500 V-pits in a 25 μm$^2$ area (of the top surface 330), or between about 200 V-pits and 400 V-pits in a 25 μm$^2$ area. In some embodiments, on the top surface 330 of the active layer 320, the V-pits 325 have a surface coverage between about 0.05 monolayers (ML) and 0.4 ML, or between about 0.1 ML and 0.2 ML. The V-pit density and coverage may be as measured with the aid of a surface analytical technique, such as an AFM or S™. For instance, STM or AFM may be used to measure the density of openings (or holes) at the surface of an active layer, and the density of openings may correspond to the density of V-pits in the active layer 320.

The device 300 may include additional layers over the active layer 320. In an example, the device 300 includes a p-type Group III-V semiconductor layer over the active layer 320. In some situations, the device 300 includes an electron blocking layer between the active layer 320 and the p-type Group III-V semiconductor layer. In an example, the p-type Group III-V semiconductor layer is formed of p-type GaN (p-GaN). In such a case, the electron blocking layer may be formed of aluminum gallium nitride.

Figure 4:
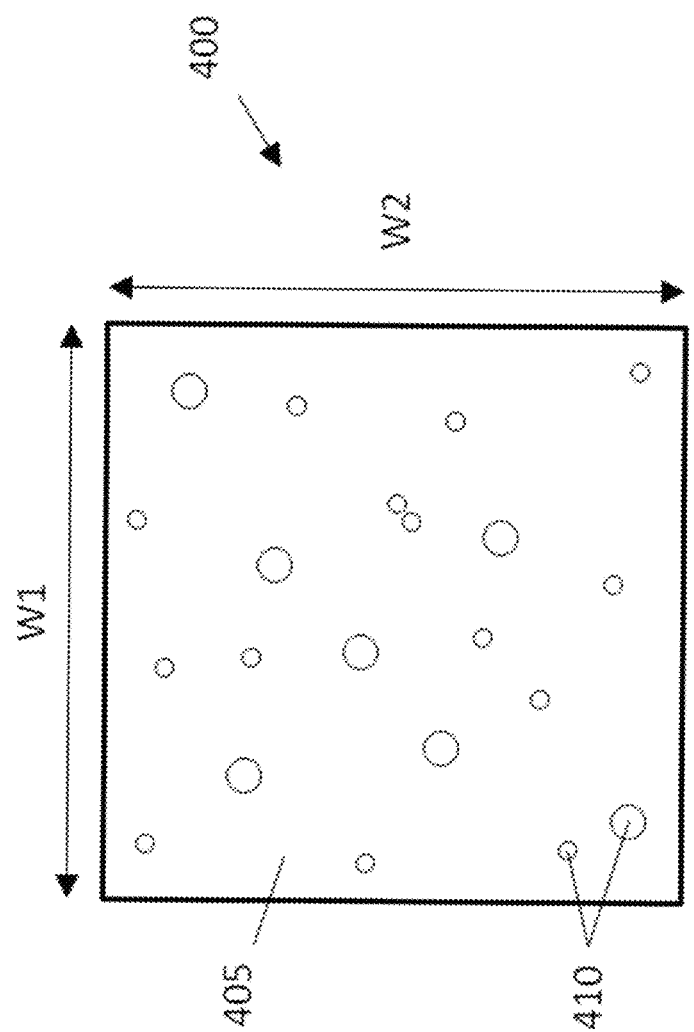
FIG. 4 schematically illustrates a top surface of an active layer (or active region) having a plurality of V-pits, in accordance with an embodiment.

FIG. 4 schematically illustrates an active layer 400 having a top surface 405, in accordance with an embodiment of the invention. The top surface 405 has a first width (W1) and a second width (W2). The first width and the second width, as illustrated, are substantially the same. The top surface 405 includes the openings of a plurality of pits 410. In some embodiments, the pits 410 are V-pits, such as those discussed above in the context of FIG. 3. The pits 410 extend into the active layer 400 and, in some cases, extend to a layer below the active layer 400, such as an n-type Group III-V semiconductor layer (not shown).

The pits 410 may have various cross-sectional areas. The pits 410 may form at or near defects in the active layer 400 and/or one or more layers below the active layer. During the growth of the active layer 400, at least some of the pits grow in size. For instance, the diameters (and cross-sectional areas) of at least some of the pits increase with increasing thickness of the active layer. In some situations, during the growth of the active layer 400, two or more pits coalesce to form a single opening at the top surface 405 of the active layer 400.

The pits may have various diameters, shapes and configuration. In some embodiments, the openings of pits 410 have diameters that are between 1 nm and 2000 nm, or between about 10 nm and 1000 nm, or between about 60 nm and 120 nm, or between about 80 nm and 100 nm. In other embodiments, the openings of pits 410 have diameters that are less than about 2000 nm, or less than about 1000 nm, or less than about 500 nm, or less than about 400 nm, or less than about 300 nm, or less than about 200 nm, or less than about 100 nm, or less than about 90 nm, or less than about 80 nm, or less than about 70 nm, or less than about 65 nm.

The top surface 405 may include pits of various sizes. In an example, some pits 410 are smaller than others. In another example, the pits 410 have substantially similar sizes. Some pits may completely extend through the active layer 400, while other pits may extend through a portion of the active layer 400 (e.g., 50% through the active layer). Some pits may grow along a vector parallel to an axis orthogonal to the top surface 405 ("surface normal", extending out of the plane of the figure), while other pits may grow along a vector that is at an angle with respect to the surface normal, such as greater than about 0°, or greater than about 5°, or greater than about 10°, or greater than about 20°, or greater than about 30°, or greater than about 40°, or greater than about 50°, or greater than about 60° with respect to the surface normal. In some cases, pit sidewall facets are about 60°.

In some embodiments, the pits have cross-sections (or openings) that are circular, triangular, square, rectangular, pentagonal, hexagonal, heptagonal, nonagonal, or combinations thereof. In some cases, the opening are partial segments (e.g., semi-circular, semi-rectangular) of these shapes.

In some embodiments, the pits are filled with one or more materials, such as a Group III-V semiconductor. The openings of pits can be filled with the one or more materials.

In an example, active layer 400 has a thickness that is less than or equal to about 200 nm, or less than or equal to about 150 nm, and a dislocation density between about $1 \times 10^9$ cm$^{-2}$ and $2 \times 10^9$ cm$^{-2}$.

Methods for Forming Light Emitting Devices

In another aspect of the invention, methods for forming a light emitting device are provided. Methods provided herein enable the formation of light emitting device active layers that are optimized for use in situations in which the active layers have dislocations densities between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$.

In some embodiments, a method for forming a light emitting device, such as a light emitting diode (LED), includes forming an n-type or p-type Group III-V semiconductor layer adjacent to an active layer. The active layer is formed by exposing a substrate in a reaction chamber to one or more Group III precursors and one or more Group V precursors at one or more growth conditions selected to generate one or more V-pits in the active layer at a surface density between about 1 V-pit/μm$^2$ and 30 V-pits/μm$^2$, or between about 10 V-pits/μm$^2$ and 20 V-pits/μm$^2$. In some cases, the Group III-V semiconductor includes gallium nitride (GaN). In some situations, upon exposing the substrate to one or more Group III precursors and one or more Group V precursors, the substrate (including any layer over the substrate) is contacted with the one or more Group III precursors and the one or more Group V precursors.

In an example, an active layer including gallium nitride barrier layers and indium gallium nitride or indium aluminum gallium nitride well layers is formed over an n-GaN layer over a silicon substrate in a reaction chamber. The growth temperature and carrier gas (e.g., H$_2$) flow rate are selected to generate an active layer having a V-pit surface coverage between about 5% and 30%, or between about 10% and 20%. In some cases, such growth conditions are selected to maintain a dislocation density between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$. In some cases, the n-GaN layer is formed over one or more additional layers (e.g., pit generation layer) over the silicon substrate. The n-GaN layer is formed using growth conditions selected to provide a dislocation density between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$ in the n-GaN layer.

A Group III-V semiconductor includes one or more Group III species and one or more Group-V species. In an example, the Group III species is gallium (Ga) and the Group V species is nitrogen. An n-type Group III-V semiconductor is a Group III-V semiconductor that is doped with an n-type dopant (e.g., Si). A p-type Group III-V semiconductor is a Group III-V semiconductor that is doped with a p-type dopant (e.g., Mg).

The reaction chamber may be a vacuum chamber configured for thin film formation. The vacuum chamber, in some cases, is an ultrahigh vacuum (UHV) chamber. In cases in which a low-pressure environment is desired, the reaction chamber may be pumped with the aid of a pumping system having one or more vacuum pumps, such as one or more of a turbomolecular ("turbo") pump, a cryopump, an ion pump and a diffusion pump and a mechanical pump. The reaction chamber may include a control system for regulating precursor flow rates, substrate temperature, chamber pressure, and the evacuation of the chamber. The reaction chamber may be part of a system configured to generate the light emitting device (see, e.g., FIG. 6).

The growth conditions are adjustable based upon the selection of one or more process parameters for forming the active layer and/or layers above and below the active layer. In some embodiments, growth conditions include one or more of growth temperature, carrier gas flow rate, precursor flow rate, growth rate and growth pressure.

In some embodiments, processing parameters provided herein are used for cases in which an active layer having a Group III-V semiconductor at a moderate to high dislocation density is formed over a silicon substrate. The dislocation density is some situations is between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$. In some cases, one or more processing parameters for forming an active layer are adjusted to provide an active layer having a V-pit density provided herein, such as between about 5% and 30%, or between about 10% and 20%, at a dislocation density between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$. In some embodiments, active layer growth conditions are selected to provide a V-pit surface density between about 5% and 30%, or between about 10% and 20%, at an active layer thickness less than or equal to about 300 nm, or less than or equal to about 200 nm, or less than or equal to about 150 nm, and at an active layer dislocation density between about $1 \times 10^8$ cm$^{-2}$ and $5 \times 10^9$ cm$^{-2}$, or between about $1 \times 10^9$ cm$^{-2}$ and $2 \times 10^9$ cm$^{-2}$. In some situations, during active layer growth, the growth temperature and carrier gas (e.g., H$_2$) flow rate are selected to achieve a predetermined density and/or distribution of V-pits.

The growth temperature is the temperature of substrate or one or more layers over the substrate upon thin film formation. In an example, the growth temperature is the substrate temperature, as measured with the aid of a pyrometer or a thermocouple in thermal contact with the substrate. In some cases, during the formation of the active layer, the temperature of the substrate is between about 750° C. and 850° C. In an embodiment, the active layer includes a quantum wall material, such as a multiple quantum well (MQW) material having a well layer and a barrier layer. In some situations, the well layer is formed at a temperature between about 750° C. and 790° C., or between about 770° C. and 780° C., and the barrier layer is formed at a temperature between about 790° C. and 850° C., or between about 810° C. and 840° C.

The precursor flow rate includes the flow rate of one or more Group III precursors and the flow rate of a Group V precursor. The flow rate specifies the volume of precursor delivered to a reaction chamber within a predetermined period of time.

Various source gases (or precursors) may be used with methods described herein. A gallium precursor may include one or more of trimethylgallium (TMG), triethylgallium, diethylgallium chloride and coordinated gallium hydride compounds (e.g., dimethylgallium hydride). An aluminum precursor may include one or more of tri-isobutyl aluminum (TIBAL), trimethyl aluminum (TMA), triethyl aluminum (TEA), and dimethylaluminum hydride (DMAH). An indium source gas may include one or more of trimethyl indium (TMI) and triethyl indium (TEI). A nitrogen precursor may include one or more of ammonia ($NH_3$), nitrogen ($N_2$), and plasma-excited species of ammonia and/or $N_2$.

In some cases, one or more precursor are provided to a reaction chamber with the aid of a carrier gas including one or more of He, Ar, $N_2$ and $H_2$. In an embodiment, the flow rate of the carrier gas during the formation of the active layer is between about 1 liter/minute and 20 liters/minute.

In some cases, the active layer is formed by exposing a substrate in a reaction chamber to one or more precursors and hydrogen ($H_2$). In an embodiment, the flow rate of hydrogen during the formation of the active layer is between about 1 liter/minute and 20 liters/minute, or between about 1 liter/minute and 10 liters/minute, or between about 4 liters/minute and 8 liters/minute. In some cases, during the formation of a quantum well active layer, the hydrogen flow rate is adjusted based on whether a well layer or barrier layer is being formed. In an embodiment, during the formation of a barrier layer (e.g., GaN barrier layer), the hydrogen flow rate is between about 1 liter/minute and 10 liters/minute, or between about 4 liters/minute and 8 liters/minute. During the formation of the well layer (e.g., indium gallium nitride), the hydrogen flow rate is reduced in relation to the flow rate of hydrogen during the formation of the barrier layer. In some situations, the flow rate of hydrogen during the formation of the well layer is terminated (i.e., at or near about 0 liters/minute).

In an implementation, the well layer is formed at a temperature (growth temperature) between about 750° C. and 790° C., or between about 770° C. and 780° C. In such a case, the barrier layer is formed at a temperature between about 790° C. and 850° C., or between about 810° C. and 840° C., and at a hydrogen flow rate between about 1 liter (L)/minute (min) and 10 L/min, or between about 4 L/min and 8 L/min. In an implementation, the barrier layer is formed at a temperature of about 820° C. In an embodiment, the hydrogen flow rate during the formation of the well layer is terminated. In some situations, the growth temperature for the barrier layer scales inversely with increasing hydrogen flow rate. That is, the higher the hydrogen flow rate, the lower the growth temperature. In some cases, the temperature for the formation of the well layer is 30° C. to 40° C. below the temperature for the formation of the barrier layer.

In an example, a barrier layer is formed over a silicon substrate in a reaction chamber by flowing TMG, $NH_3$ and $H_2$ into the reaction chamber at an $H_2$ flow rate of about 6 liters/minute. After a predetermined period of time, the $H_2$ flow rate is terminated and an indium precursor is introduced into the reaction chamber along with TMG and $NH_3$ to form a well layer. Such operations may be repeated as desired to form a multiple quantum well layer with a period (i.e., the number of barrier-well stacks) as desired.

The growth rate is the rate of growth of various device layers, such as the active layer. In some situations, the growth rate is dependent on the precursor flow rate. That is, the higher the flow rate of precursor into the reaction chamber, the higher the growth rate. In other situations, the growth rate is dependent on the flow rate of hydrogen. In other situations, the growth rate depends on one or more factors selected from precursor flow rate, hydrogen flow rate, carrier gas flow rate, reaction chamber pressure and growth temperature.

In some embodiments, a method for forming a light emitting diode (LED) includes forming an active layer by exposing a substrate in a reaction chamber to a Group III precursor and a Group V precursor to form an active layer having one or more V-pits at a surface density between about 1 V-pit/$\mu m^2$ and 30 V-pits/$\mu m^2$, or between about 10 V-pits/$\mu m^2$ and 20 V-pits/$\mu m^2$. During the formation of the active layer: i) the temperature of the substrate is between about 750° C. and 850° C., and/or ii) the flow rate of hydrogen ($H_2$) into the reaction chamber is less than or equal to about 20 liters/minute. In a particular implementation, during the formation of the active layer, i) the temperature of the substrate is between about 750° C. and 850° C., and ii) the flow rate of hydrogen ($H_2$) into the reaction chamber is less than or equal to about 20 liters/minute. In some situations, the flow rate of hydrogen is less than about 10 liters/minute.

The term "substrate" includes a substrate with or without additional material layers over the substrate. In some situations, exposing the substrate, in the reaction chamber, to a Group III precursor and a Group V precursor includes exposing one or more layers over the substrate to the Group III precursor and the Group V precursor. In other situations, exposing the substrate, in the reaction chamber, to a Group III precursor and a Group V precursor includes exposing the substrate to the Group III precursor and the Group V precursor. In an embodiment, the substrate includes a layer of an n-type or p-type Group III-V material, and the active layer is formed over the layer of the n-type or p-type Group III-V material. In an example, the active layer is formed over an n-GaN layer formed over a silicon substrate.

In some situations, during the formation of the active layer the substrate is exposed to (and in some cases contacted with) the Group III precursor and the Group V precursor simultaneously. In other situations, during the formation of the active layer the substrate is exposed to the Group III precursor and the Group V in an alternating fashion (e.g., the Group III precursor followed by the Group V precursor).

In some embodiments, a method for forming a light emitting diode (LED) includes providing a substrate in a reaction chamber and heating the substrate at a first temperature between about 750° C. and 790° C. A well layer is then formed on or over the substrate by directing into the reaction chamber a Group III precursor and a Group V precursor, wherein the well layer is formed at a first carrier gas flow rate. In some situations, other precursors are directed into the reaction chamber to form the well layer. Next, the substrate is heated at a temperature between about 790° C. and 850° C. and a barrier layer is formed adjacent to the well layer by directing into the reaction chamber the Group III precursor and the Group V precursor. The barrier layer is formed at a second carrier gas flow rate. In some cases, the first carrier gas flow rate is less than the second carrier gas flow rate.

In an embodiment, the second carrier gas flow rate is between about 1 liter/minute and 10 liters/minute, or between about 4 liters/minute and 8 liters/minute. The carrier gas may include one or more of hydrogen ($H_2$), nitrogen ($N_2$), argon (Ar) and Helium (He). In some cases, the carrier gas is hydrogen. The carrier gas aids in the growth of the barrier layer and/or the well layer. In some embodiments, the carrier gas is used during the formation of the barrier layer but not the well layer. In an example, during the formation of the barrier layer, the flow rate of hydrogen is between about 1 liter/minute and 10 liters/minute, or between about 4 liters/minute and 8 liters/minute. In such a case, during the formation of the well layer, the flow rate of hydrogen may be reduced or terminated.

Figure 5:
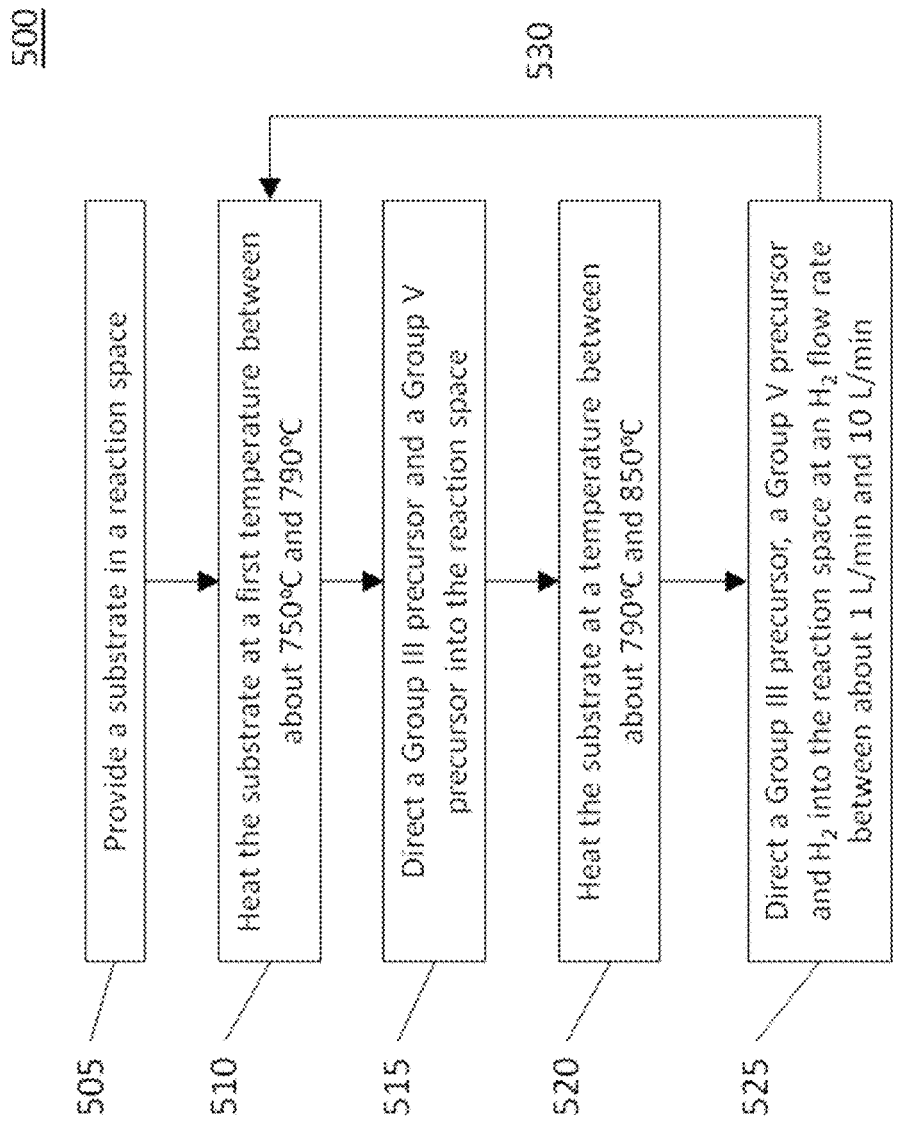
FIG. 5 shows a method for forming a quantum well active layer for a light emitting device, in accordance with an embodiment.

FIG. 5 schematically illustrates a method 500 for forming a quantum well active layer for a light emitting device, in accordance with an embodiment of the invention. In a first operation 505, a substrate is provided in a reaction chamber. The substrate is selected to have a moderate to high dislocation density between about $1\times10^8$ cm$^{-2}$ and $5\times10^9$ cm$^{-2}$, or between about $1\times10^9$ cm$^{-2}$ and $2\times10^9$ cm$^{-2}$. In an example, the substrate is silicon (e.g., n-type silicon). Next, in a second operation 510, the substrate is heated at a first temperature between about 750° C. and 790° C. In some situations, the first temperature is between about 770° C. and 780° C. The substrate may be heated with the aid of a resistive heating, such as with the aid of a susceptor adjacent to the substrate. The temperature of the substrate may be adjusted from an initial temperature at a predetermined heating or cooling rate.

Next, in a third operation 515, with the substrate at the first temperature, a well layer is formed over the substrate by directing into the reaction chamber one or more well layer precursors. In some embodiments, with the well layer including a Group-III-V material, one or more Group III precursors and one or more Group V precursors are directed into the reaction chamber to form a well layer having a Group III-V semiconductor. The substrate is exposed to the one or more precursors at the first temperature until a well layer of predetermined thickness is formed.

For instance, in cases in which a well layer having a Group III-V semiconductor is desired, one or more Group III precursors and one or more Group V precursors are directed into the reaction chamber and exposed to the substrate. In an example, the Group III-V semiconductor of the well layer includes indium gallium nitride, and the well layer is formed by directing trimethyl indium (TMI), trimethyl gallium (TMG), and NH$_3$ and/or nitrogen (N$_2$) in to the reaction chamber. In another example, the Group III-V semiconductor of the well layer includes aluminum gallium nitride, and the well layer is formed by directing trimethyl aluminum (TMA), TMG, and NH$_3$ and/or N$_2$ into the reaction chamber.

Next, in a fourth operation 520, the substrate is heated at a second temperature between about 790° C. and 850° C. In some situations, the second temperature is between about 810° C. and 840° C. The temperature of the substrate may be adjusted from the first temperature to the second temperature at a predetermined heating rate. For instance, the temperature of the substrate may be increased from the first temperature to the second temperature at a heating rate between about 0.1° C./second and 10° C./second, or between about 0.5° C./second and 5° C./second. In an example, the heating rate is about 1° C./second.

Next, in a fifth operation 525, with the substrate at the second temperature, a barrier layer is formed over the substrate by directing into the reaction chamber one or more barrier layer precursors and hydrogen (H$_2$). In some situations, the barrier layer includes a Group III-V species. In such cases, a Group III precursor, a Group V precursor and hydrogen (H$_2$) are directed into the reaction chamber. The substrate is exposed to the one or more barrier layer precursors and H$_2$ at the second temperature until a barrier layer of predetermined thickness is formed. In some embodiments, during the formation of the barrier layer, the flow rate of hydrogen is between about 1 liter/minute (L/min) and 10 L/min, or between about 4 L/min and 8 L/min.

For instance, in cases in which a barrier layer having a Group III-V semiconductor is desired, a Group III precursor, Group V precursor and H$_2$ are directed into the reaction chamber. In an example, Group III-V semiconductor includes gallium nitride, the Group III precursor includes a gallium source gas, such as TMG, and the Group V precursor includes NH$_3$ or nitrogen (N$_2$). The flow rate of hydrogen in such a case is between about 1 L/min and 10 L/min, such as, e.g., 6 L/min.

Next, the operations 510-525 may be repeated 530 to form an active layer with a predetermined period of well-barrier stacks. In an example, the operations 510-525 are repeated once, twice, three times, four times, five times, six times, or seven times to form a MQW active layer.

In some embodiments, between operations 505 and 510, one or more additional layers are formed over the substrate. In an example, an n-type Group III-V semiconductor layer is formed over the substrate prior to forming the active layer with the aid of operations 510-530. In other embodiments, following the formation of the active layer, one or more layers are formed on the active layer. In an example, a p-type Group III-V semiconductor layer is formed on the active layer.

Following the formation of the active layer per the method 500, one or more additional layers are formed over the active layer. In some embodiments, a p-type Group III-V semiconductor layer is formed over the active layer. In an example, the p-type Group III-V semiconductor layer includes p-type GaN. Additional front side and/or back side contacts are also formed to provide an electric flow path to the n-type Group III-V semiconductor layer and the p-type Group III-V semiconductor layer.

One or more layers of light emitting devices provided herein may be formed by a vapor (or gas phase) deposition technique. In some embodiments, one or more layers of the light emitting devices provided herein are formed by chemical vapor deposition (CVD), atomic layer deposition (ALD), plasma enhanced CVD (PECVD), plasma enhanced ALD (PEALD), metal organic CVD (MOCVD), hot wire CVD (HWCVD), initiated CVD (iCVD), modified CVD (MCVD), vapor axial deposition (VAD), outside vapor deposition (OVD) and/or physical vapor deposition (e.g., sputter deposition, evaporative deposition).

While methods and structures provided herein have been described in the context of light emitting devices having Group III-V semiconductor materials, such as gallium nitride, such methods and structures may be applied to other types of semiconductor materials. Methods and structures provided herein may be used with light emitting devices having active layers formed of gallium nitride (GaN), gallium arsenide (GaAs), aluminum gallium arsenide (AlGaAs), gallium arsenide phosphide (GaAsP), aluminum gallium indium phosphide (AlGaInP), gallium phosphide (GaP), indium gallium nitride (InGaN), aluminum gallium phosphide (AlGaP), zinc selenide (ZnSe), aluminum nitride (AlN), aluminum gallium nitride (AlGaN), and aluminum gallium indium nitride (AlGaInN).

Systems Configured to Form Light Emitting Devices

In an aspect of the invention, a system for forming a light emitting device includes a reaction chamber for holding a substrate, a pumping system in fluid communication with the reaction chamber, the pumping system configured to purge or evacuate the reaction chamber, and a computer system having a processor for executing machine readable code implementing a method for forming an active layer. The code may implement any of the methods provided herein. In an embodiment, the code implements a method including forming an active layer by exposing the substrate in the reaction chamber to a Group III precursor and a Group V precursor to form an active layer having one or more V-pits at a surface density between about 1 V-pit/μm² and 30 V-pits/μm², or between about 10 V-pits/μm² and 20 V-pits/μm². During the formation of the active layer: i) the temperature of the substrate is between about 750° C. and 850° C., and/or ii) the flow rate of hydrogen (H₂) into the reaction chamber is less than or equal to about 20 liters/minute.

FIG. 6 shows a system 600 for forming a light emitting device, in accordance with an embodiment of the invention. The system 600 includes a reaction chamber 605 having a susceptor (or substrate holder) 610 configured to hold a substrate that is used to form the light emitting device. The system includes a first precursor storage vessel (or tank) 615, a second precursor storage vessel 620, and a carrier gas storage tank 625. The first precursor storage vessel 615 may be for holding a Group III precursor (e.g., TMG) and the second precursor storage vessel 620 may be for holding a Group V precursor (e.g., NH₃). The carrier gas storage tank 625 is for holding a carrier gas (e.g., H₂). The system 600 may include other storage tanks or vessels, such as for holding additional precursors and carrier gases.

The system 600 further includes a vacuum system 630 for providing a vacuum to the reaction chamber 605. The vacuum system 630 is in fluid communication with the reaction chamber 605. In some cases, the vacuum system 630 is configured to be isolated from the reaction pace 605 with the aid of a valve, such as a gate valve. A controller (or control system) 635 of the system 600 implements a method for forming a light emitting device in the reaction chamber 605, such as forming one or more layers of the light emitting device. The controller 635 is communicatively coupled to a valve of each of the first precursor storage vessel 615, the second precursor storage vessel 620, the carrier gas storage tank 625 and the vacuum system 630. The controller 635 is operatively coupled to the susceptor 610 for regulating the temperature of the susceptor and a substrate on the susceptor, and the vacuum system 630 for regulating the pressure in the reaction chamber 605.

In some situations, the vacuum system 630 includes one or more vacuum pumps selected from a turbomolecular ("turbo") pump, a cryopump, an ion pump and a diffusion pump and a mechanical pump. A pump may include one or more backing pumps. For example, a turbo pump may be backed by a mechanical pump.

In some embodiments, the controller 635 is configured to regulate one or more processing parameters, such as the substrate temperature, precursor flow rates, growth rate, hydrogen flow rate and reaction chamber pressure. The controller 635 includes a processor configured to aid in executing machine-executable code that is configured to implement the methods provided herein. The machine-executable code is stored on a physical storage medium, such as flash memory, a hard disk, or other physical storage medium configured to hold computer-executable code.

In some embodiments, the controller 635 is configured to regulate one or more processing parameters to generate an active layer with a V-pit surface density (or coverage) between about 5% and 30%, or between about 10% and 20%, at an active layer thickness less than or equal to about 300 nm, or less than or equal to about 200 nm, or less than or equal to about 150 nm, and at an active layer dislocation density between about $1\times10^8$ cm⁻² and $5\times10^9$ cm⁻², or between about $1\times10^9$ cm⁻² and $2\times10^9$ cm⁻².

EXAMPLE

FIG. 7A is an AFM micrograph of a 5 μm×5 μm surface of an active layer formed on silicon (Sample A). The active region of Sample A has a thickness of about 300 nm. FIG. 7B is an AFM micrograph of a 5 μm×5 μm surface of an active layer formed on silicon (Sample B). The active region of Sample B has a thickness of about 150 nm. The active layers of Sample A and Sample B have dislocation densities between about $1\times10^9$ cm⁻² and $2\times10^9$ cm⁻². The surface of Sample A has a V-pit surface coverage of about 30%, and the surface of Sample B has a V-pit surface coverage of about 10%. LED's are formed on silicon having active layers with thicknesses and V-pit surface coverages of Samples A and B. An LED having the active layer of Sample B has a light output efficiency that is about 40% higher than an LED having the active layer of Sample A. FIGS. 7A and 7B illustrate that LED's with highly dislocated materials and thinner active regions are more efficient light generators than LED's with highly dislocated materials and thicker active regions.

Unless the context clearly requires otherwise, throughout the description and the claims, words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A light emitting diode (LED), comprising:
   a first layer comprising an n-type Group III-V semiconductor;
   a second layer adjacent to the first layer, the second layer comprising an active layer that generates light upon the recombination of electrons and holes and has a thickness between 50 nm and 200 nm;
   a third layer adjacent to the second layer, the third layer comprising a p-type Group III-V semiconductor; and
   a silicon substrate adjacent to one of either the first layer or the third layer,
   wherein the active layer comprises one or more V-pits having one or more openings at an interface between the active layer and the third layer, the V-pits having a density between about 10 V-pits/μm² and 20 V-pits/μm² at the interface and a density between about 10% and 20% of a surface coverage of the interface.

2. The LED of claim 1, wherein the active layer has a dislocation density between about $1\times10^8$ cm⁻² and $5\times10^9$ cm⁻².

3. The LED of claim 1, wherein the n-type Group III-V semiconductor comprises n-type gallium nitride and the p-type Group III-V semiconductor comprises p-type gallium nitride.

4. The LED of claim 1, wherein the LED has an external quantum efficiency of at least about 50%.

5. The LED of claim 1, wherein the n-type Group III-V semiconductor is an n-type gallium nitride (GaN) layer, and the V-pits are formed on or around defects in the n-type GaN layer.

6. A light emitting diode (LED), comprising:
a first layer having an n-type Group III-V semiconductor;
a second layer adjacent to the first layer, the second layer having an active layer that generates light upon the recombination of electrons and holes and has a thickness between 50 nm and 200 nm, the second layer having one or more V-pits at a density between about 10% and 20% of a surface coverage of the second layer and at a density between about 10 V-pits/µm$^2$ and 20 V-pits/µm$^2$ at a surface of the second layer; and
a third layer adjacent to the second layer, the third layer having a p-type Group III-V semiconductor.

7. The LED of claim 6, further comprising a substrate adjacent to the first layer or third layer.

8. The LED of claim 7, wherein the substrate is formed of silicon or sapphire.

9. The LED of claim 6, wherein the LED has an external quantum efficiency of at least about 50%.

10. The LED of claim 6, wherein the n-type Group III-V semiconductor comprises n-type gallium nitride and the p-type Group III-V semiconductor comprises p-type gallium nitride.

11. The LED of claim 6, wherein the active layer comprises a plurality of quantum wells.

12. The LED of claim 6, wherein the active layer comprises alternating gallium nitride and indium gallium nitride or indium aluminum gallium nitride thin films.

13. The LED of claim , wherein the active material layer has a dislocation density between about $1 \times 10^8$ cm$^{-2}$ and $5 \times 0^9$ cm$^{-2}$.

14. The LED of claim 7, wherein the n-type Group III-V semiconductor is an n-type gallium nitride (GaN) layer, and the V-pits are formed on or around defects in the n-type GaN layer.

15. A light emitting diode (LED), comprising:
an n-type gallium nitride (GaN) layer;
a p-type GaN layer; and
an active layer that is formed between the n-type GaN layer and the p-type GaN layer and has a thickness between 50 nm and 200 nm, the active layer comprising one or more V-pits having one or more openings at an interface between the active layer and the n-type GaN layer or the p-type GaN layer, the one or more openings consuming between about 10% and 20 % of the interface,
wherein the active layer includes the one or more openings at a density between about 10 V-pits/µm$^2$ and 20 V-pits/µm$^2$ at the interface.

16. The LED of claim 15, further comprising a substrate adjacent to the n-type GaN layer or p-type GaN layer.

17. The LED of claim 16, wherein the substrate is formed of silicon or sapphire.

18. The LED of claim 15, wherein the active layer comprises one or more quantum well stacks, an individual stack comprising a barrier layer and a well layer adjacent to the barrier layer.

19. The LED of claim 15, wherein the active layer includes a plurality of periods, and wherein at least one period of the plurality of periods includes indium gallium nitride layer or indium aluminum gallium nitride.

20. The LED of claim 19, wherein the at least one period of the plurality of periods includes gallium nitride.

21. The LED of claim 15, wherein said interface is between the active layer and the p-type GaN layer.

22. The LED of claim 15, wherein the active layer has a dislocation density between about $1 \times 10^8$ cm$^{-2}$ and $5 \times 10^9$ cm$^{-2}$.

23. The LED of claim 15, wherein the V-pits are formed on or around defects in the n-type GaN layer.

24. An active layer for use in a light emitting diode (LED), comprising a light emitting layer having a thickness between 50 nm and 200 nm and one or more V-pits at coverage between about 10% and 20% of a surface,
wherein the light emitting layer includes the one or more V-pits at a density between about 10 V-pits/µm$^{-2}$ and 20 V-pits/µm$^2$ at the surface.

25. The active layer of claim 24, wherein the active layer has an external quantum efficiency of at least about 50%.

26. The active layer of claim 24, wherein the active layer comprises a well layer and a barrier adjacent to the well layer.

27. The active layer of claim 26, further comprising i) an additional barrier layer adjacent to the well layer, or ii) an additional well layer adjacent to the barrier layer.

28. The LED of claim 22, wherein the light emitting material layer has a dislocation density between about $1 \times 10^8$ cm$^{-2}$ and $5 \times 10^9$ cm$^{-2}$.

* * * * *